United States Patent

Yu et al.

[11] Patent Number: 5,865,649
[45] Date of Patent: *Feb. 2, 1999

[54] CARD EDGE CONNECTOR HAVING MEANS FOR PREVENTING OVERSTRESS OF CONTACT ELEMENTS

[75] Inventors: Wang-I Yu, Taipei; Jui-Chu Lin, Tao-Yuan, both of Taiwan

[73] Assignee: Berg Technology, Inc., Reno, Nev.

[ * ] Notice: The term of this patent shall not extend beyond the expiration date of Pat. No. 5,676,555.

[21] Appl. No.: 518,994

[22] Filed: Aug. 24, 1995

[51] Int. Cl.⁶ .................................................. H01R 23/70
[52] U.S. Cl. ...................................... 439/637; 439/733.1
[58] Field of Search .................................... 439/630–637, 439/839, 833, 326, 327, 492, 59, 62, 733.1

[56] References Cited

U.S. PATENT DOCUMENTS

| 3,422,394 | 1/1969 | Antes | 439/637 |
| 4,109,986 | 8/1978 | Mouissie | 439/637 |
| 4,461,522 | 7/1984 | Bakermans et al. | 439/636 |
| 4,701,002 | 10/1987 | Mouissie | 439/630 |
| 5,239,748 | 8/1993 | Hamilton | 439/637 |
| 5,292,260 | 3/1994 | Sinisi et al. | 439/441 |

*Primary Examiner*—Gary Paumen
*Assistant Examiner*—Tho D. Ta
*Attorney, Agent, or Firm*—Daniel J. Long; M. Richard Page

[57] ABSTRACT

Disclosed is a card edge connector which has a pivoting latching mechanism that has a pair of parallel fingers that direct inward transverse forces on the opposed sides of the printed wiring board to secure it in the connector. The connector also includes a plate on each of the contact elements which prevents overstressing of the arcuate element of the contact. The plate also includes a longitudinal projection and an opposed longitudinal recess so that the adjacent contact elements may be connected to resist axial forces.

4 Claims, 9 Drawing Sheets

CARD EDGE CONNECTOR HAVING MEANS FOR PREVENTING OVERSTRESS OF CONTACT ELEMENTS

CROSS REFERENCE TO RELATED APPLICATION

This application is related to application Ser. No. 08/518,969, file on Aug. 24, 1995 entitled A "Card Edge Connector Having Means for Applying Inward Transverse Force on Printed Wiring Boards" now U.S. Pat. No. 5,676,555 and application Ser. No. 08/526,797, filed on Aug. 23, 1995 entitled "Connector" now U.S. Pat. No. 5,749,750 both of which are filed contemporaneously herewith.

BACKGROUND OF INVENTION

1. Field of the Invention

The present invention relates to electrical connectors and more particularly to card edge connectors.

2. Brief Description of the Prior Developments

Various card edge connectors are known in the art in which the front edge of a printed wiring board is inserted in a longitudinal groove of the insulated housing. Adjacent that groove there are a plurality of contacts with arcuate conductive sections arranged in side by side relation adjacent the groove so that conductive pads on the printed wiring board contact the arcuate sections of the contacts as the board is inserted into the groove. Such edge card connectors may employ latches for locking the printed wiring board into the connector.

In such arrangements the printed wiring board must be firmly affixed in the connector. A continuing need, therefore, exists for improved latches for firmly and efficiently affixing the wiring board in the connector.

Another problem which may occur with such devices is that the contact elements may be overstressed as the printed wiring board is inserted into the groove, resulting in a loss of contact normal force. A need, therefore, exists for a means of preventing such overstressing of the contact elements.

Another problem involves the fact that a large number of side by side contacts must be inserted into the housing and securely retained therein, in a manner that does not impart undue stress on the housing and yet resists forces that would tend to push the contacts out of the housing. A need, therefore, exists for means of providing optimum insertion and retention of the contacts in the housing.

SUMMARY OF THE INVENTION

In the card edge connector of the present invention, latching mechanisms are provided on each side of the insulative housing to secure the printed wiring board in position. These latching mechanisms are pivotally connected to upstanding sections of the insulative housing and pivot in an arc to engage upper tabs on upstanding end sections of the insulative housing. These vertical tabs are positioned on opposite sides of the printed wiring board so that, as the latching mechanism is pivoted into position, parallel fingers on the latching mechanism press the upwardly extending tabs on the vertical section of the insulative housing toward each other to provide an inwardly directed transverse force on the printed wiring board to secure it in position.

In the card connector of the present invention, there is also a vertical plate which extends upwardly from the base section of each of the contacts. This plate has an upper surface which is opposed to the terminal end of the arcuate section of the contact and prevents overstress of that arcuate section as the printed wiring board is engaged with the contact.

On the plate section of each of the contacts there is also a longitudinal projection which has an opposed longitudinal recess. Each such projection engages a groove in the housing so that a longitudinal guiding function is provided during initial insertion of the contacts. The projection cooperates with the housing to retain the contact in the housing after final insertion.

BRIEF DESCRIPTION OF THE DRAWINGS

The present is further described with reference to the accompanying drawings in which:

FIG. 3A is an enlarged view of the bottom portion of the edge connector in circle 111A in FIG. 2.

FIG. 3B is a sectional view through line V—V of FIG. 3a

DETAILED DESCRIPTION OF THE PREFERRED EMBODIMENTS

Referring to the FIGS. 1–7, the edge connector includes a molded insulative housing 10 which has a first end 12 and a second end 14 which are connected by a groove 15 in its topside 16. This housing also includes a bottom side 18 and a first lateral side 20 and a second lateral side 22. A printed wiring board is shown in phantom lines generally at numeral 23. This board has a front edge 24 which engages the groove in the housing and an opposed top edge 25 and a first side edge 26 and a second side edge 27. The front edge is supported on board rest 28. The printed wiring board has conductive pads (not shown) disposed along each side of edge 24. Rows as at 29 and 30 (FIG. 2) are positioned on opposite sides of the groove 15. Each contact or terminal 29 or 30 forms an electrical connection with a corresponding one of the conducting pads. Extending from the bottom side of the housing are leads as at 32 and 34 and non-conductive locating pins as at 36 and 38 both of which engage a mother board (not shown). The housing also includes a first upstanding member 40 which has a groove 41 aligned with and substantially the same width as groove 15 and a second upstanding member 42 which also has a groove 43 aligned with and substantially the same width as groove 15. Tabs 44 and 46 extend from members 40 and 42 respectively. The grooves 41 and 43 also extend vertically through these tabs. The housing also includes stand-offs as at 48 and 50 which bear against the mother board when the housing is engaged with the mother board. Finally, the edge connector includes a first latching member shown generally at numeral 52 and a second latching member shown generally at 54.

Figure 1:
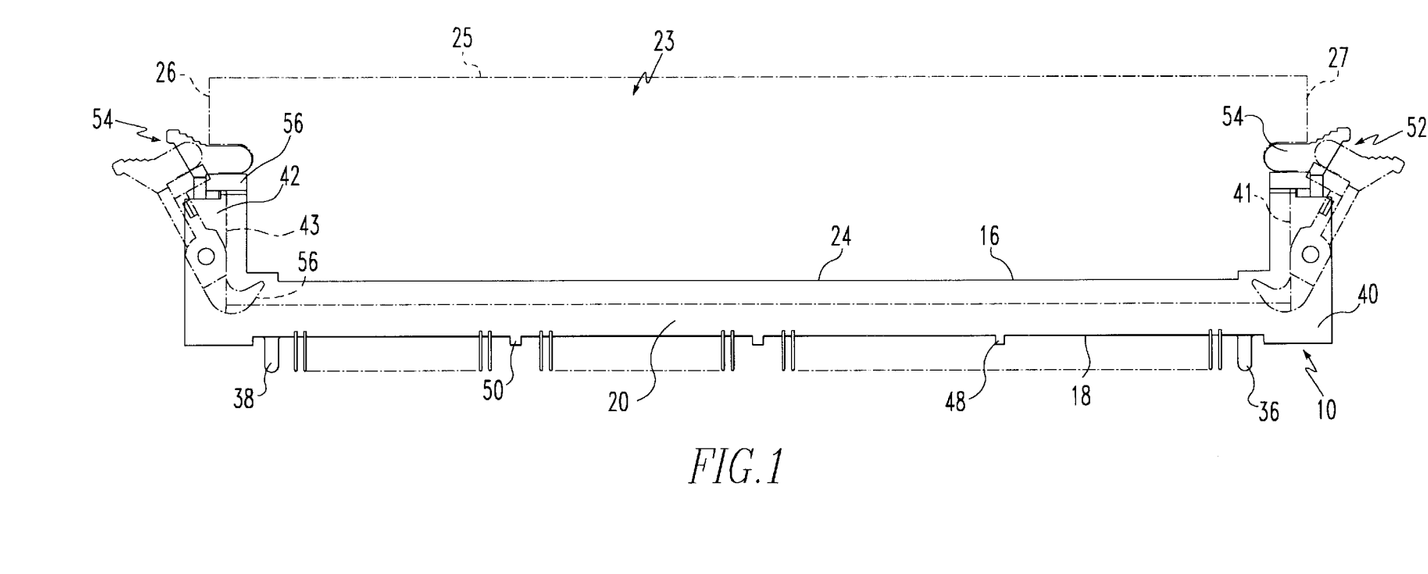
FIG. 1 is a side elevational view of a preferred embodiment of the edge connector of the present invention.
Figure 2:
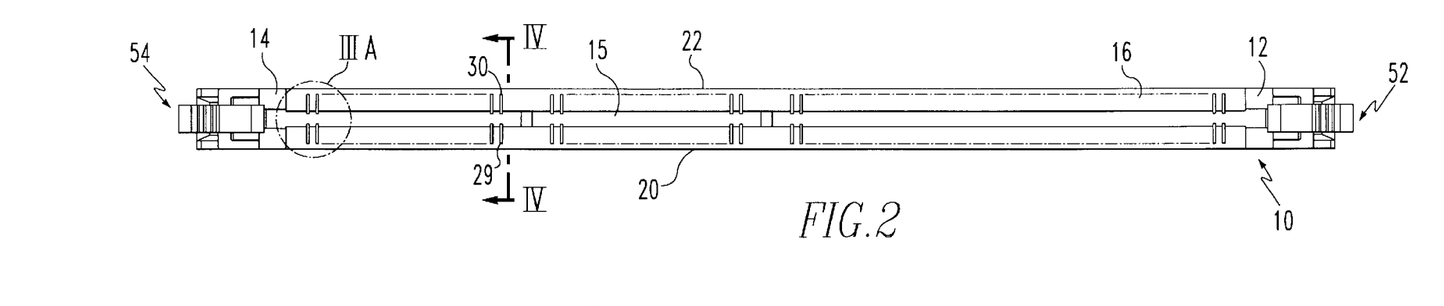
FIG. 2 is a top plan view of the edge connector shown in FIG. 1.
Figure 3:
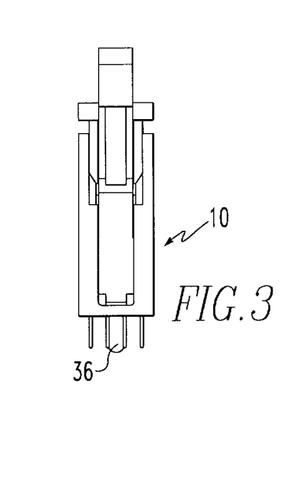
FIG. 3 is an end view of the edge connector shown in FIG. 1.
Figures 3A, 3B:
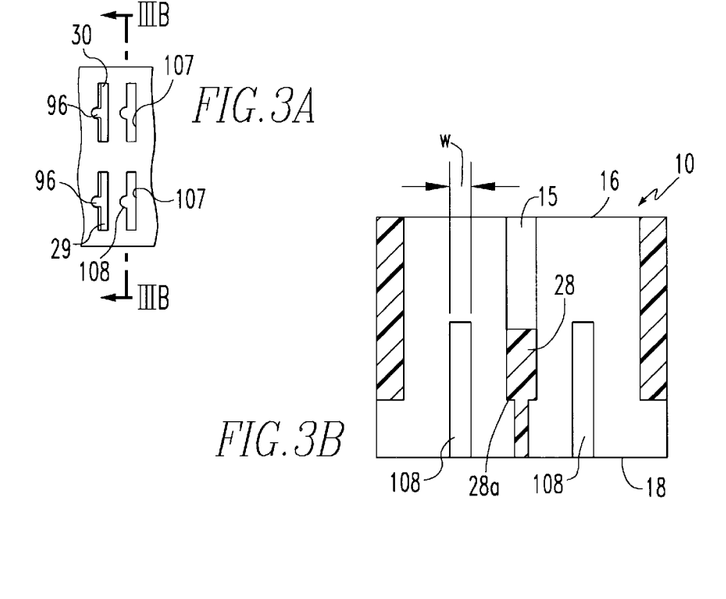
Figure 4:
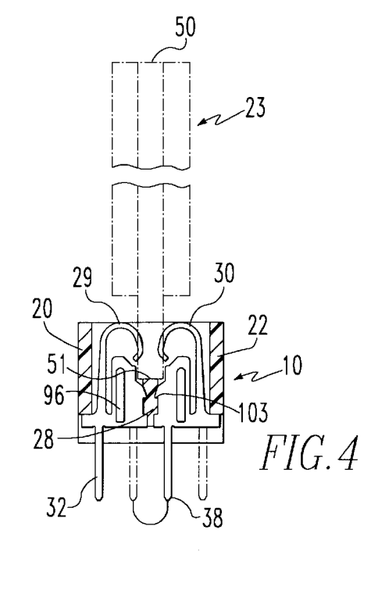
FIG. 4 is a cross sectional view through line IV—IV in FIG. 2.
Figure 5:
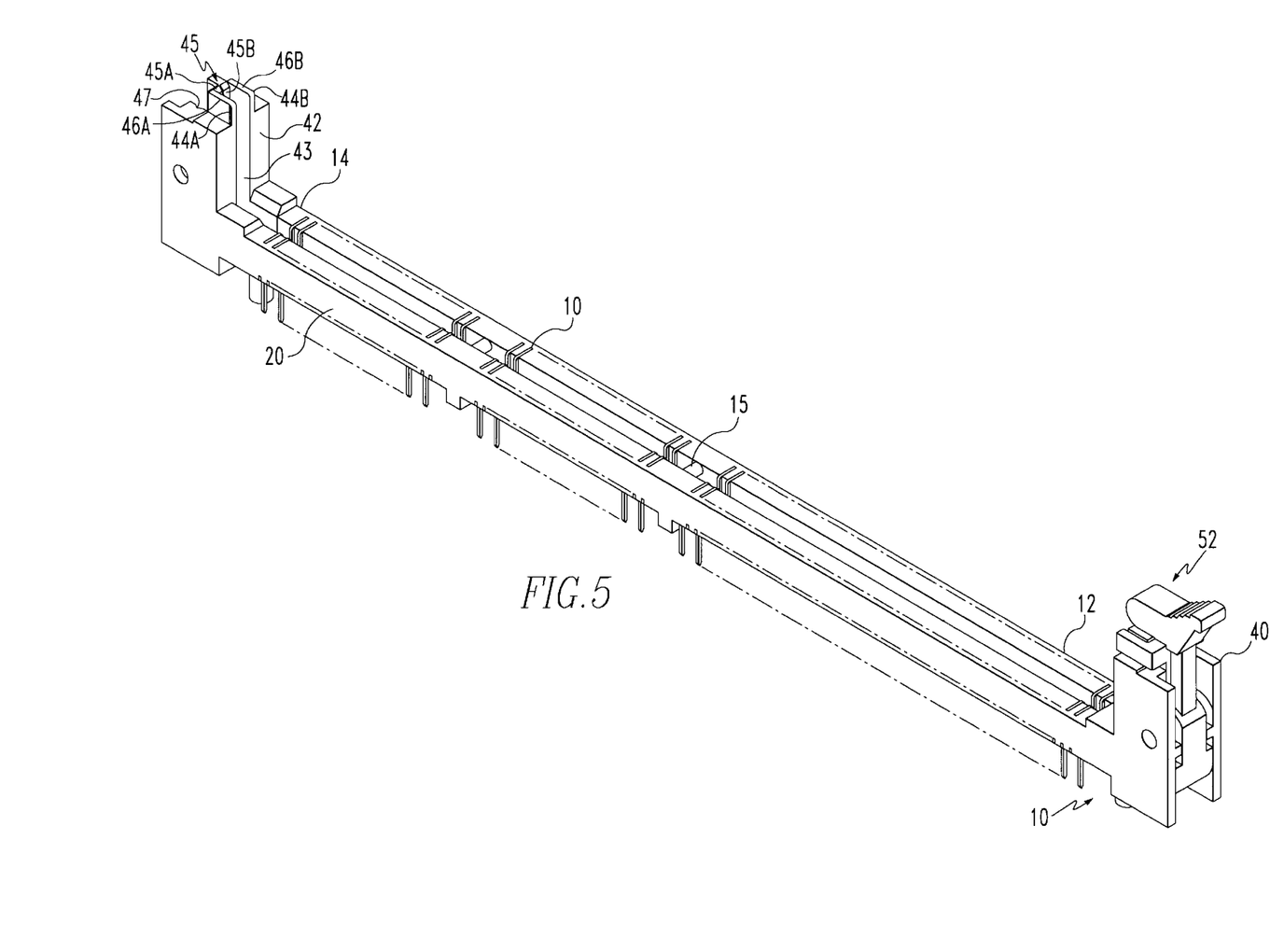
FIG. 5 is a perspective view of the edge connector shown in FIG. 1 in which one latching mechanism has been removed to better display other aspects of the edge connector.
Figure 6:
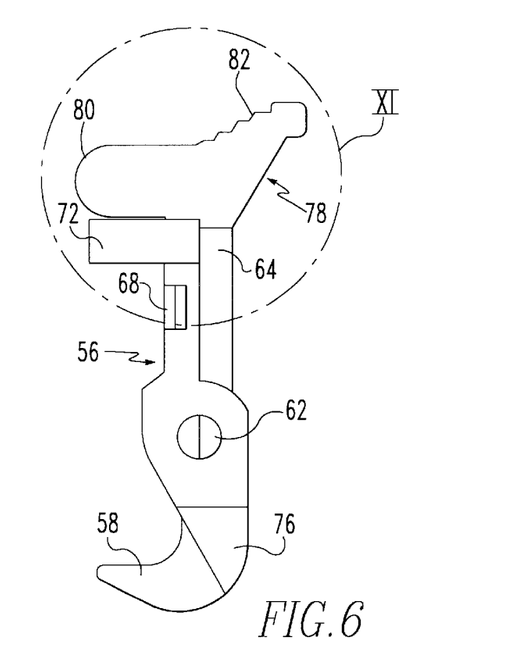
FIG. 6 is a side elevational view of the latching mechanism used in the edge connector of the present invention.
Figure 7:
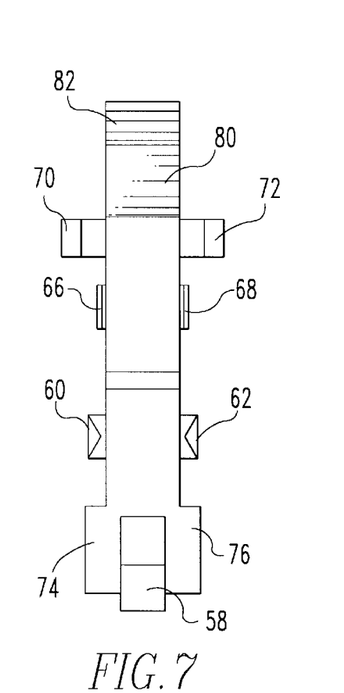
FIG. 7 is a front view of the latching mechanism shown in FIG. 6.
Figure 8:
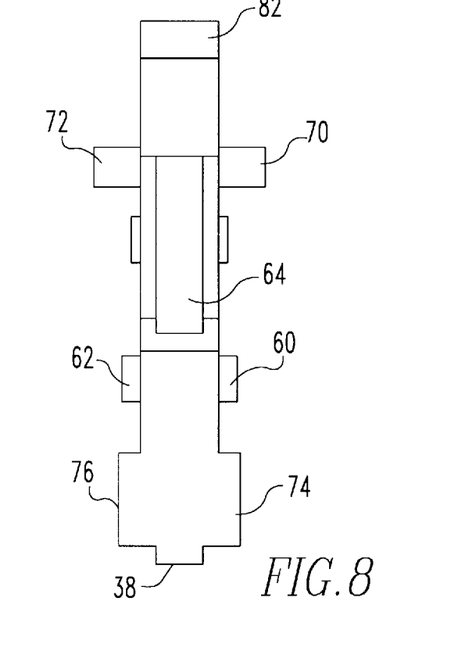
FIG. 8 is a rear view of the latching mechanism shown in FIG. 6.
Figure 9:
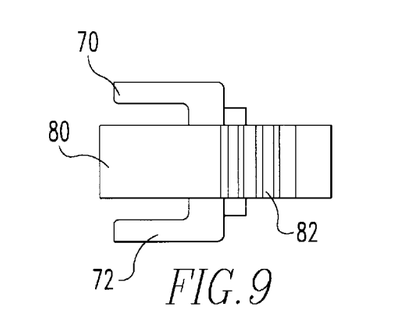
FIG. 9 is a top plan row of the latching mechanism shown in FIG. 6.
Figure 10:
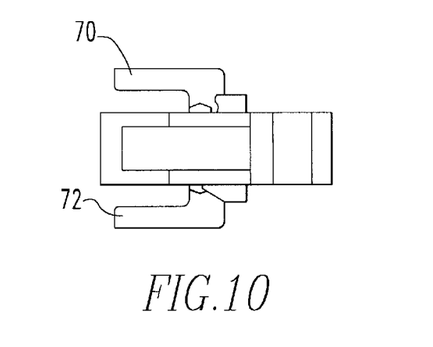
FIG. 10 is a bottom view of the latching mechanism shown in FIG. 6.
Figure 11:
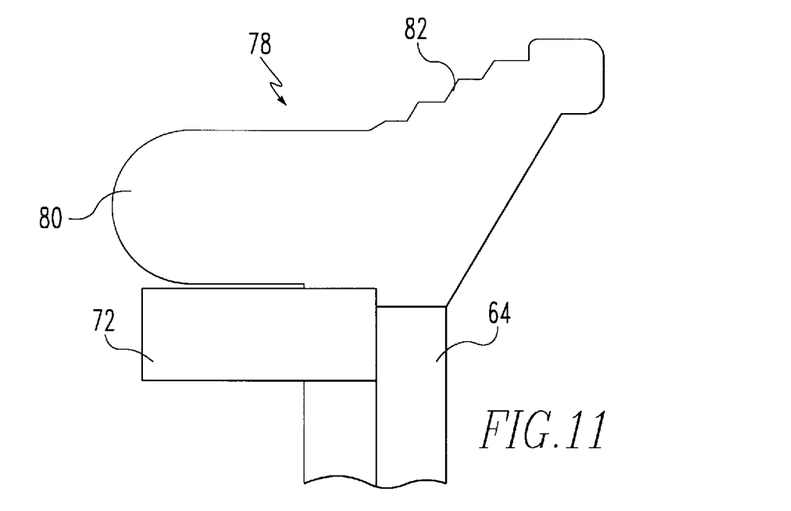
FIG. 11 is a detailed view of the area within circle XI in FIG. 6.
Figure 12:
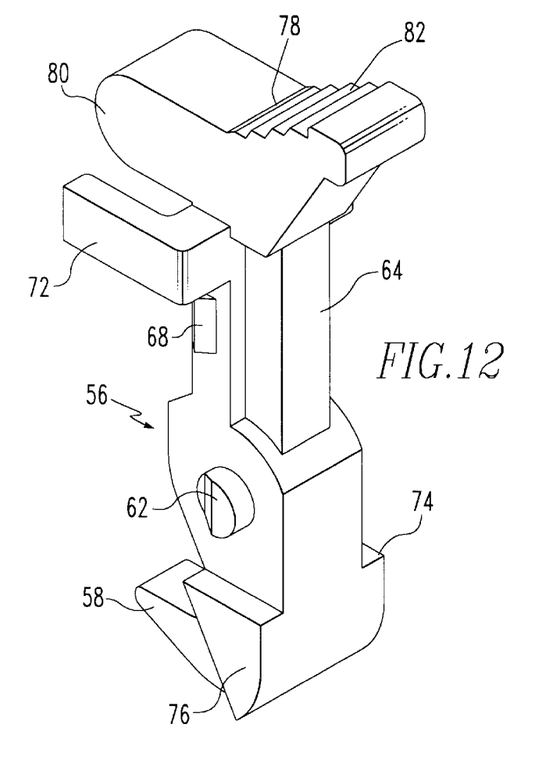
FIG. 12 is a perspective view of the latching mechanism shown in FIG. 6.

Referring to FIG. 5, each tab 44, 46 has a raised rib, such as ribs 46A, 46B extending adjacent the front edge of the tab. The upstanding members 40 and 42 each include a split web 45 having portions 45A and 45B. The web is split so that the opposed portions of each of upstanding members 40 and 42 can move toward and away from each other. On the interior surfaces of the upstanding members, 40 and 42, adjacent the webs 45 are a pair of V-shaped grooves 47 that are sized to receive the projections 66, 68 of the latching mechanisms.

Referring to FIG. 6–11, each of these latching mechanisms includes an upper shank 56 and a lower ejectment hook 58. On the upper shank there are lateral pivot projections 60 and 62 by means of which the latching mechanism is fixed to apertures in the insulative housing. The latching mechanisms also include a longitudinal rib 64, lateral engagement projections 66 and 68, fingers 70 and 72 and lateral tabs 74 and 76. Each of the latching members pivots on projections 60 or 62 from a position in which it is engaged with printed wiring boards to a rearward angular position in which it is disengaged from the board. With the latches in their rearward disengaged position, the printed wiring board is inserted in the housing so that its front edge engages groove 15 and its side edges respectively engage grooves 41 and 43 in the vertical members 40, 42. Because the web 45 is split, the grooves 41 and 43 are slightly wider than the thickness of the board and the board easily slips into the connector. As the printed wiring board is pushed into slot 15, the edge 24 of the board engages the ejectment hook 85 of each latch causing the latch to pivot on projections 60, 62. As the latch pivots, fingers 70 and 72 slide over tabs 44 and 46. The fingers 70 and 72 engage the raised ribs 44A and 46A on the tabs 44, 46 and cam these tabs inwardly so that the edges of grooves 41 and 43 are pressed against and clamp against the opposed lateral sides of the printed wiring board to thereby securely hold the printed wiring board in the connector. As the latch moves to the closed position, the projections 66 and 68 snap into the grooves 47, so that each latch is locked in the closed position. The latching mechanism also includes a head section shown generally at numeral 78. In the locked position, the front nose 80 of the head section will engage a recess in the printed wiring board so that the board is properly located and secured in position. The latching mechanism will ordinarily be manipulated by means of the finger tab 82, to rotate the latch and eject the board from the connector.

Figure 13:
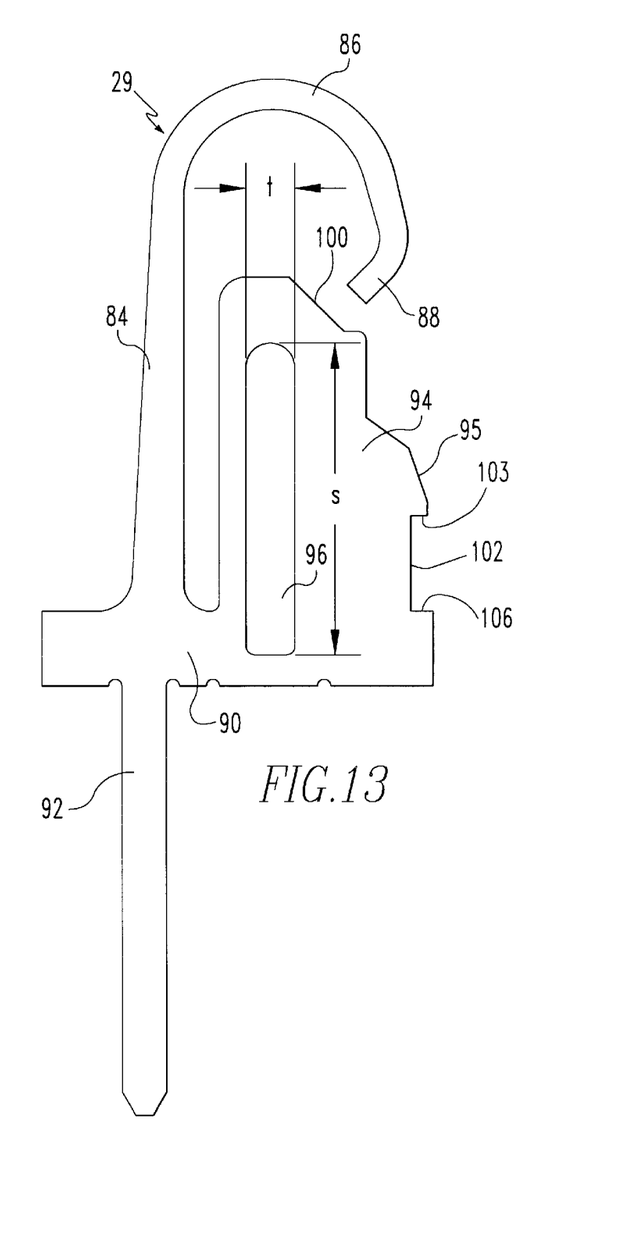
FIG. 13 is a side elevational view of one of the contact elements shown in FIG. 1.
Figure 14:
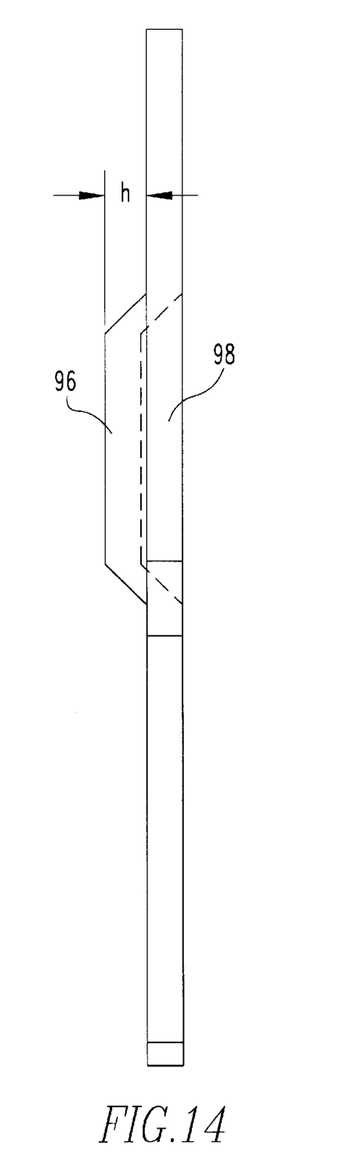
FIG. 14 is an end view of the contact elements shown in FIG. 13.
Figure 15:
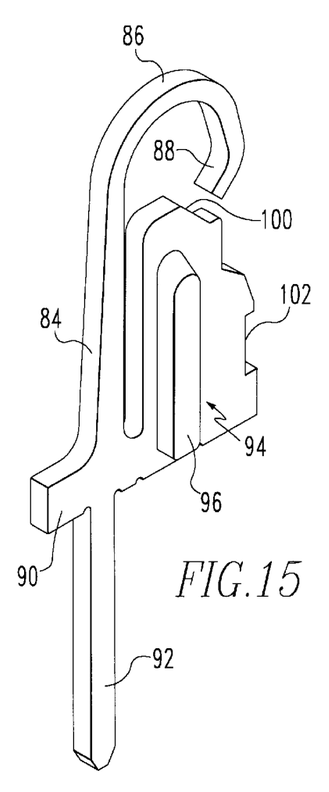
FIG. 15 is a perspective view of the contact elements shown in FIG. 13.
Figure 16:
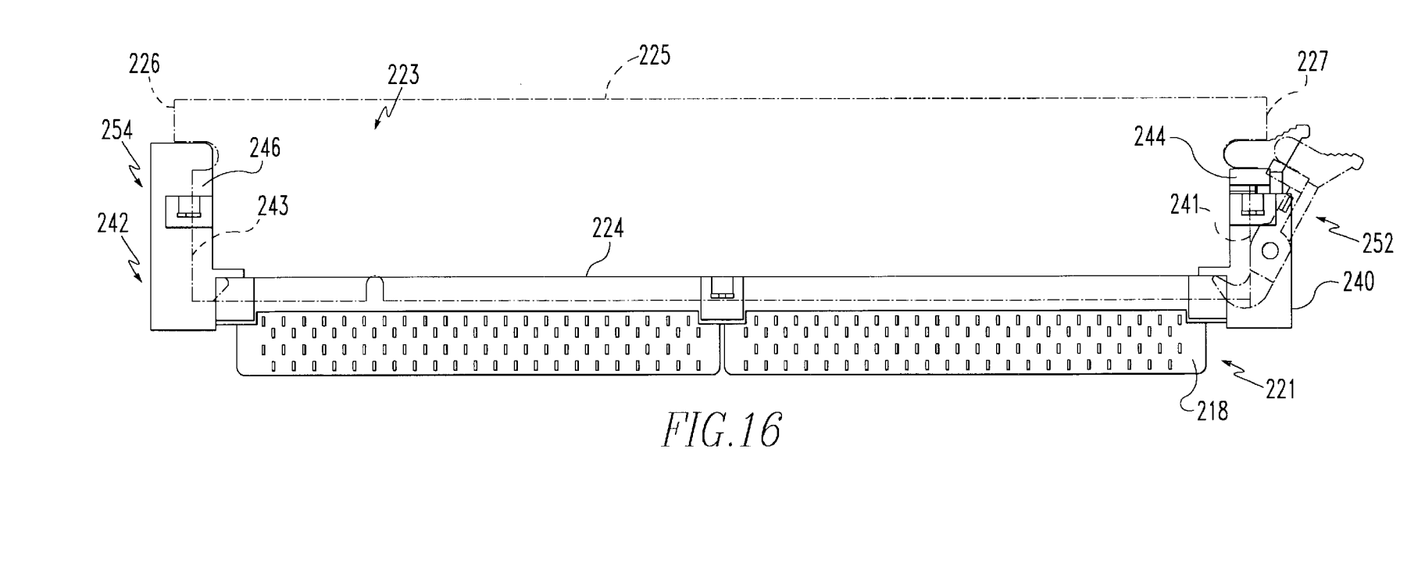
FIG. 16 is a side elevational view of a preferred embodiment of the printed wiring board edge connector of the present invention.
Figure 17:
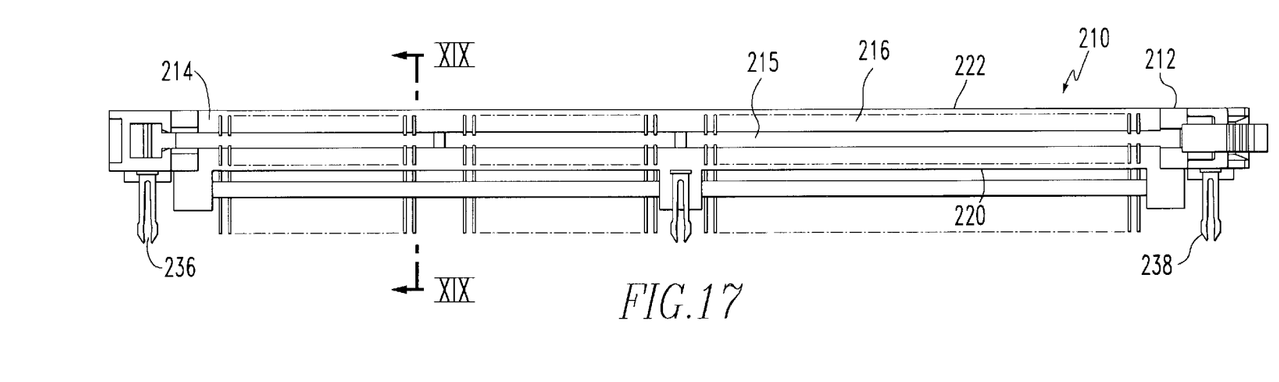
FIG. 17 is a top plan view of the edge connector shown in FIG. 16.
Figure 18:
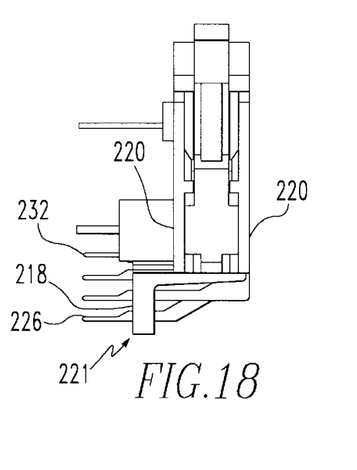
FIG. 18 is an end view of the edge connector shown in FIG. 16.
Figure 19:
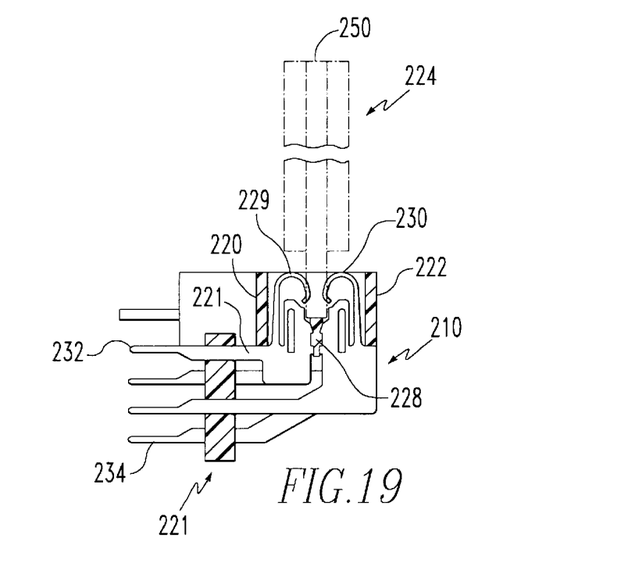
FIG. 19 is a cross sectional view through XIX—XIX in FIG. 17.

Referring to FIGS. 13 and 14, each of the contact elements includes a cantilevered contact arm including a vertical section 84, an arcuate section 86 and a terminal end 88 on the arcuate section. The vertical section extends from a base 90 and in the opposite direction from the vertical section there is a lead 92 extending from the base. Also extending laterally and vertically and from the base is a support plate 94 for mounting the terminal in housing 10. Extending from a side of the support plate there is an elongated projection 96 preferably stamped from plate 94 and on the opposite side of the support plate from this projection there is a recess 98. In a position opposed to the terminal end of the arcuate section the support plate has a terminal end support surface 100 formed in an edge of plate 94. The purpose of this surface is to prevent overstressing of the arcuate section as the printed wiring board is inserted into the groove of the insulated housing. The gap between surface 100 and the tip of terminal end 88 is dimensioned so that, as the tip end is moved as a result of insertion of the board, the tip end will bump against surface 100 before there is any permanent deformation of the contact arm. The outer edge 95 of the support plate also has a recessed surface 102 that has, at an upper edge, a retention barb 103 and, along the lower edge, a locating surface 106. As can be seen in FIG. 13, the barb 103 is positioned at a location along plate 94 that is intermediate the longitudinal extent of projection 96.

Each of the contacts 29, 30 is received in one of a plurality of terminal or contact recesses 107 in the housing of connector 10. Each recess 107 includes a groove 108 extending in one of the side walls of the recess. The width w of this groove (FIG. 3B) is slightly wider than the width t of the projection 96. Preferably, the dimension s, which locates the top of the projection 96, is such that when the contact is in its final position, the top portion of the projection 96, is positioned at the top of the groove 108. The groove 108 extends from the bottom surface 18 toward top surface 16 and is substantially in alignment with the direction of insertion of board 23 into board receiving groove 15.

The projection 96 and groove 108 interact in the following manner. When the contacts 29, 30 are loaded for insertion in housing 10, they can be placed with the projection 96 in the groove 108. Because the groove is slightly wider than the projection, the projection slides in the groove until the barb 103 engages the board rest 28. By appropriate dimensioning of the height h of the projection, the longitudinal outer surface of the projection bears lightly on the bottom surface of the groove 108 to provide a relatively low transversely directed force to cause the opposed side of the plate 94 to bear against the side wall of recess 107 opposed to groove 108. As a result of the transverse force, sufficient axial retention force is generated to retain the terminal in the housing prior to final assembly. After final assembly the combined effects of this retention force and the retention force generated by barb 103, the contacts are held axially in the housing. This retention is achieved without generating a high transverse force in the direction of the longitudinal axis of the housing, which can be cumulative along the row of contacts and result in warpage of the housing. The cooperation between projection 96 and groove 108 also serves to preliminarily position and locate the contacts properly for final insertion. This is especially useful for hand insertion. When all the contacts are so loaded, a final insertion step, such as one using an air cylinder, can be used to push all the contacts into final position in each recess 107. In the final position the locating surface 106 is positioned against step 28a in the board rest 28.

It should be noted that the hollow projection 96 can be viewed as a simply supported structure with its ends connected to plate 94. The elongated projection imparts a limited transverse force, thereby limiting the tendency for the contacts to impart stress on the housing that could cause warpage.

Referring to FIGS. 16–19 a second embodiment of the edge connector includes a molded insulated housing 210 which has a first end 212 and a second end 214 which are connected by a groove 215 in its topside 216. This housing includes a first lateral side 220 and a second lateral side 222. A right angled section 221 having a base side 218 extends below the housing. A printed wiring board is shown in phantom lines generally at numeral 223. This board has a front edge 224 which engages the groove in the housing and an opposed top edge 225 and a first edge 226 and a second edge 227. The front edge is supported on board rest 228. As is conventional, the printed wiring board has conductive pads which are connected to contact elements as at 229 and 230 which are positioned on opposite sides of the groove. Extending from the base side at the right angle section are leads as at 232 and 234 and non-conductive pins as at 236 and 238 both of which engage a mother board. The housing also includes the first vertical member 240 which has a groove 241 which is a continuation of groove 215 and a second vertical member 242 which also has a groove 243 which is continuation of groove 215. Tabs 244 and 246 which have a thinner thickness than the vertical members extend vertically upwardly, respectively, from vertical members. The grooves 241 and 243 also extend vertically through these tabs. Finally the edge connector includes a first latching member shown generally at numeral 252 and a second latching member shown generally at 254. These latching members may be essentially identical to those shown above in FIGS. 6–11.

Figure 20:
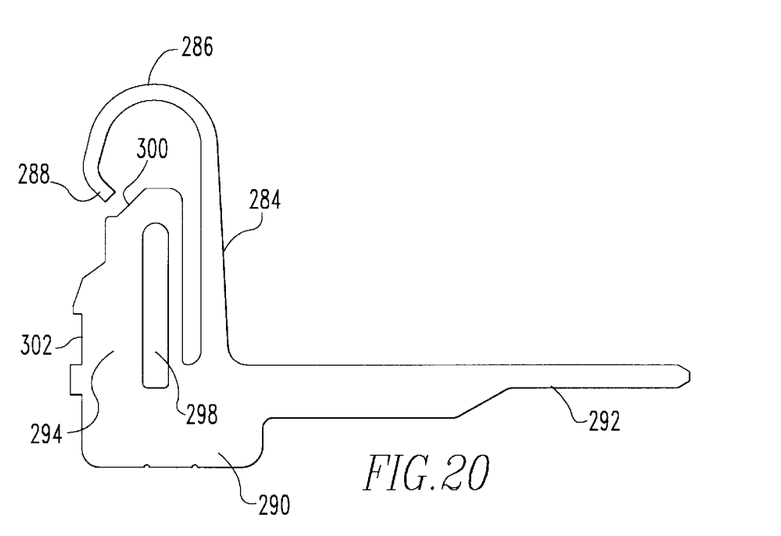
FIG. 20 is a side elevational view of a contact element used in the edge connector shown in FIG. 16.
Figure 21:
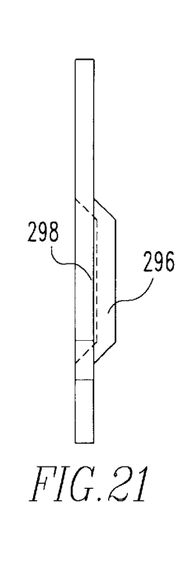
FIG. 21 is an end view of the contact element shown in FIG. 20.

Referring to FIGS. 20 and 21, each of the contact elements comprises a vertical section 284 an arcuate section 286 and a terminal end 288 on the arcuate section. The vertical section extends from a base 290. Extending laterally from the base there is a lead 292. Extending vertically from the base is a support plate 294. Extending longitudinally from this support plate there is a projection 296 and on the opposite side of the support plate from this projection there is a recess 298. In a position opposed to the terminal end of the arcuate section the support plate has a terminal end support surface 300. The purpose of this surface is to prevent overstressing of the arcuate section as the printed wiring board is inserted into the groove of the insulated housing. The support plate also has another recessed surface 302.

It will be appreciated that a card edge connector has been described which effectively, efficiently and economically secures the printed wiring board prevents overstressing the arcuate sections of the contact element and prevents axial displacement and disengagement of the contact elements.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A connector for receiving a circuit board comprising, an elongated housing having opposed ends, a bottom side, a pair of parallel longitudinal sides and a longitudinal board receiving groove interposed between said longitudinal sides such that an edge of the circuit board is receivable in said board receiving groove, transverse contact receiving recesses having opposed side walls with a longitudinal axial projection receiving groove in one of said side walls and at least one longitudinal row of electrical contact elements positioned adjacent said board receiving groove and at least one of the contact elements having a base section and a support plate which extends upwardly from said base section and has a projection extending in normal relation from said plate to engage the longitudinal axial projection receiving groove in one of the side walls of one of the transverse contact receiving recesses for imparting an axial retention force on the at least one contact element and wherein the at least one contact element has a first section which extends upwardly from the base section and a generally arcuate second section which extends transversely from the first section to a terminal end spaced from the plate and the plate is positioned to be engageable by said terminal end so as to provide an overstress protection surface for the contact.

2. The connector of claim 1, wherein the at least one longitudinal row of electrical contact elements positioned adjacent said card receiving groove comprises a plurality of said at least one contact element.

3. The connector of claim 1, wherein the terminal end of the contact element extends generally radially inwardly from the arcuate section.

4. The connector of claim 3, wherein the support plate has a contact engagement surface which is generally normal to the terminal end of the contact.

* * * * *